(12) United States Patent
Kaluzni et al.

(10) Patent No.: US 7,394,027 B2
(45) Date of Patent: Jul. 1, 2008

(54) MULTI-LAYER PRINTED CIRCUIT BOARD COMPRISING A THROUGH CONNECTION FOR HIGH FREQUENCY APPLICATIONS

(75) Inventors: Heiko Kaluzni, Grossenhain (DE); Andreas Huschka, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 114 days.

(21) Appl. No.: 11/180,756

(22) Filed: Jul. 13, 2005

(65) Prior Publication Data
US 2006/0131611 A1    Jun. 22, 2006

(30) Foreign Application Priority Data
Dec. 17, 2004    (DE) .................. 10 2004 060 962

(51) Int. Cl.
  *H01R 12/04*    (2006.01)
  *H05K 1/00*    (2006.01)
(52) U.S. Cl. .................. 174/262; 361/794; 29/830
(58) Field of Classification Search ......... 174/262–266; 361/792–795; 29/830, 840, 842
See application file for complete search history.

(56) References Cited
U.S. PATENT DOCUMENTS 5,689,091 A * 11/1997 Hamzehdoost et al. ...... 174/255
5,829,127 A * 11/1998 Hagner .................... 29/846
6,229,095 B1    5/2001 Kobayashi ................. 174/255
2002/0034839 A1    3/2002 Iwaki et al. ................ 438/107
2002/0180004 A1    12/2002 Oggioni et al. ............. 257/621
2004/0069529 A1    4/2004 Oggioni et al. ............. 174/262
2005/0230813 A1    10/2005 Nakamura et al. .......... 257/698
2005/0247482 A1 * 11/2005 Nakamura ................. 174/262

FOREIGN PATENT DOCUMENTS

DE       103 05 855 A1    8/2004
WO       WO 98/27793       6/1998
WO       WO 2004/107830 A1    9/2004
WO       WO 2005/084089 A1    9/2005

OTHER PUBLICATIONS

Jillek and Keller, "Handbuch der Leiterplattentechnik," vol. 4, p. 524, 2003.
International Search Report dated Jun. 29, 2006.

* cited by examiner

*Primary Examiner*—Jeremy C Norris
(74) *Attorney, Agent, or Firm*—Williams, Morgan & Amerson, P.C.

(57) ABSTRACT

A high frequency multi-layer printed circuit board, according to the present invention, comprises a through connection having an impedance adapting structure surrounding the through connection and enabling an adjustment of the characteristic impedance of the through connection to a desired value. Thus, high frequency signals may be led through the printed circuit board with reduced signal deformation. The high frequency multi-layer printed circuit board is applicable for high frequency signals up to the GHz-range.

16 Claims, 5 Drawing Sheets

MULTI-LAYER PRINTED CIRCUIT BOARD COMPRISING A THROUGH CONNECTION FOR HIGH FREQUENCY APPLICATIONS

BACKGROUND OF THE INVENTION

1. Field of the Invention

The present invention relates to the field of connecting techniques for high frequency devices, and, more particularly, to a through connection for multi-layer printed circuit boards for high frequency applications.

2. Description of the Related Art

As semiconductor manufacturers continue to scale down on-chip features, the on-chip operating frequencies of those reduced size features may be accordingly increased, due substantially to reduced parasitic device capacitances. While, some applications, for example, state of the art microprocessors, may be driven with an on-chip operating frequency (clock rate) that may be higher than the input/output frequency, other applications, for example, high frequency transmitter and receiver devices, e.g., for wireless local area networks (WLANs) or mobile phones, may need to input/output high frequency signals in the GHz-range. For example, a WLAN transceiver may supply/receive a 2.4 GHz-signal to/from a connected antenna that may, for instance, be printed on a common substrate. Typically, integrated circuit die are mounted on a substrate and connected to other devices by conduction lines formed on an elaborate multi-layer substrate. In particular, connections for high frequency signals of more than 300 MHz are subjected to certain constraints with respect to the employed substrate materials and the line design and may be formed, for example, by microstrip lines to provide connection lines with a controlled impedance. Conventional through connections, however, may cause signal reflection and attenuation of high frequency signals, in particular in the GHz range.

On the other hand, as a general rule, scaled features enable increased functionality at a maintained die size, or a reduced die size at a maintained functionality. In both cases, however, the density of inputs and outputs (I/Os) on the die is increased. For a conventional peripheral bond pad arrangement, the resulting bond pad pitch (the distance between the centers of two adjacent bond pads) is accordingly reduced. Thus, bonding of die of advanced integrated circuits, in particular for high frequency integrated circuits, is a challenge for manufacturers of electronic components. Typically, integrated circuit devices are mounted on a substrate and the contact pads of the device are connected to corresponding pads on the substrate by wire bonding, tape automated bonding (TAB) or flip chip bonding techniques.

Contrary to wire bonding and TAB, flip chip bonding is not restricted to the employment of peripheral bond pads. The flip chip technology, however, requires an equal bump pitch on the die and on the substrate to which the die is to be bonded. The minimal bump pitch achievable on a substrate depends on the carrier material and on the corresponding available technology. In general, bond pad redistribution is required to provide reliable and cost-efficient components. Consequently, semiconductor manufacturers arrange the bond pads in two or more rows disposed in the peripheral region of the chip area (peripheral array), or redistribute the peripheral bond pads over the entire chip area (area array) to allow for a higher bond pad pitch. For high frequency integrated circuits, die with on-die redistribution of bump pads and chip carriers providing the required functionality are, in general, not available.

As a high frequency chip carrier material may be employed, for example, ceramic, polyimide or flame-retardant fiberglass epoxy laminate (FR4). In large-scale production, FR4 is, in spite of the poor material properties (high dielectric constant, high loss angle), even for high frequency applications, a widely used material for its economical benefits. Through connections formed with conventional FR4 printed circuit board (PCB) technologies, however, may cause undue high frequency signal deformation.

In view of the above-mentioned problems, there exists a need for an improved connection technique for devices in high frequency applications.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment of the present invention, a high frequency multi-layer printed circuit board is provided. The printed circuit board comprises a layer stack comprising a first metal-comprising layer, a second metal-comprising layer and at least one dielectric layer separating the first and second metal-comprising layers. The printed circuit board further comprises a transition structure comprising a through connection extending from the first metal-comprising layer through the at least one dielectric layer to the second metal-comprising layer, and an impedance adapting structure surrounding the through connection at least partially and providing a characteristic impedance of the transition structure, the characteristic impedance being adapted to a desired impedance value.

In accordance with another illustrative embodiment of the present invention, a high frequency multi-layer printed circuit board comprising a layer stack comprising a first metal-comprising layer, a second metal-comprising layer and at least one dielectric layer separating the first and second metal-comprising layers is provided. The printed circuit board further comprises a transition structure comprising a through connection extending from the first metal-comprising layer through the at least one dielectric layer to the second metal-comprising layer and an impedance adapting structure formed in the first and second metal-comprising layers, wherein the first and second metal-comprising layers comprise substantially concentric metal-free regions surrounded by metal-containing regions, the metal-free regions being substantially coaxially aligned to the through connection and having a diameter being adapted to a desired value of the characteristic impedance of the transition structure.

In accordance with yet another illustrative embodiment of the present invention, a high frequency multi-layer printed circuit board comprising a layer stack comprising a first metal-comprising layer and a second metal-comprising layer, at least one metal-comprising inner layer disposed between the first and second metal-comprising layers, and at least two dielectric layers separating the metal-comprising layers is provided. The printed circuit board further comprises a transition structure comprising a through connection extending from the first metal-comprising layer through the at least one metal-comprising inner layer and the at least two dielectric layers to the second metal-comprising layer, and an impedance adapting structure formed in the inner metal-comprising layer, wherein the inner metal-comprising layer comprises a substantially concentric metal-free region surrounded by a metal-containing region, the metal-free region being substantially coaxially aligned to the through connection and having a diameter being adapted to a desired value of the characteristic impedance of the transition structure.

In accordance with still another illustrative embodiment of the present invention, a high frequency multi-layer printed circuit board comprising a layer stack comprising a first metal-comprising layer and a second metal-comprising layer, at least two metal-comprising inner layers disposed between the first and second metal-comprising layers, and at least three dielectric layers separating the metal-comprising layers is provided. The printed circuit board further comprises a transition structure comprising a through connection extending from the first metal-comprising layer through the at least two metal-comprising inner layers and the at least three dielectric layers to the second metal-comprising layer, and an impedance adapting structure connecting at least two of the at least two metal-comprising inner layers conductively by a plurality of coaxial vias arranged on a substantially circular line substantially coaxially aligned with the through connection.

In accordance with a further illustrative embodiment of the present invention, a high frequency device is provided. The device comprises an integrated high frequency circuit die comprising a high frequency terminal and a high frequency multi-layer printed circuit board comprising a transition structure, wherein the integrated high frequency circuit die is mounted on the high frequency multi-layer printed circuit board and the high frequency terminal is connected to the transition structure, wherein the transition structure comprises a through connection and an impedance adapting structure.

In accordance with still a further illustrative embodiment of the present invention, a method of manufacturing a high frequency multi-layer printed circuit board is provided. The method comprises choosing a desired impedance value and forming a layer stack comprising at least a first metal-comprising layer and a second metal-comprising layer and at least one dielectric layer separating the first and second metal-comprising layers. The method further comprises forming a through connection extending from the first metal-comprising layer through the at least one dielectric layer to the second metal-comprising layer, and forming an impedance adapting structure surrounding the through connection at least partially and adapting therewith the characteristic impedance of a transition structure to the desired impedance value, wherein the transition structure is comprised of the through connection and the impedance adapting structure.

BRIEF DESCRIPTION OF THE DRAWINGS

The invention may be understood by reference to the following description taken in conjunction with the accompanying drawings, in which like reference numerals identify like elements, and in which.

Figure 1A:
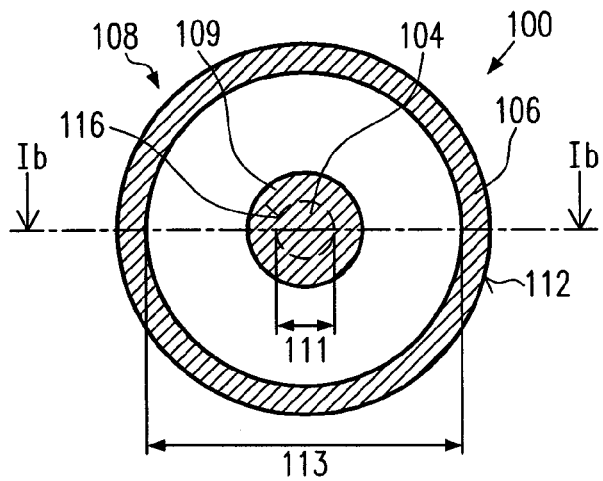
FIG. 1a depicts a plan view and FIG. 1b a sectional view at the section line indicated in FIG. 1a of a transition structure according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Furthermore, the used geometric terms such as concentric, circular and coaxial relate to features which may not necessarily exhibit a precise geometric accuracy. The actual shape of the corresponding features may diverge from the precise geometric shape unless the functionality of the features is not unduly affected, for example, due to manufacturing tolerances.

With reference to FIGS. 1a, 1b, 2, 3a, 3b, 4, 5a, 5b, 6a, 6b, 7a and 7b, further illustrative embodiments of the present invention will now be described in more detail, wherein similar or identical components are denoted by the same reference numeral except for the first digit, which is selected in correspondence with the number of the respective figure.

Figure 1B:
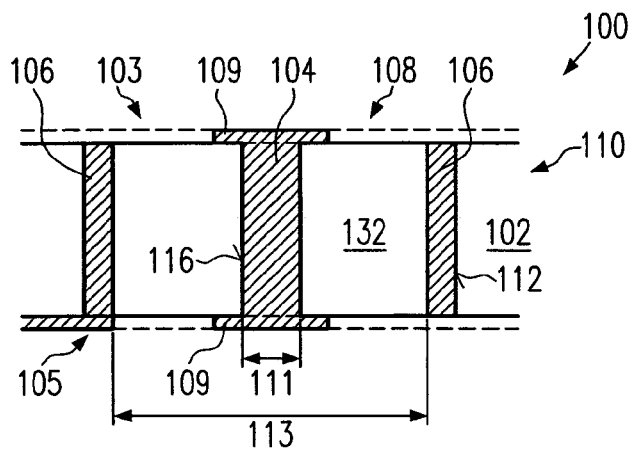

FIG. 1a schematically represents a plan view and FIG. 1b depicts a sectional view of an embodiment of a high frequency multi-layer printed circuit board 100 comprising a layer stack 110 and a transition structure 108. The layer stack 110 comprises a first metal-comprising layer 103, a second metal-comprising layer 105 and at least one dielectric layer 102. The transition structure 108 is comprised of an impedance adapting structure 106, a through connection 104, a dielectric material region 132 and pads 109.

The high frequency multi-layer printed circuit board 100 may be formed by laminating a layer stack 110 by conventional multi-layer PCB techniques. The first and second metal-comprising layers 103, 105 may, for example, comprise copper, gold or aluminum, and may have a thickness in the range of approximately 5-200 μm. The copper-comprising layer may be coated by a passivation layer (not shown) comprising, for example, gold, nickel, tin, lead, or a combination thereof. The thickness of the passivation layer may be in the range of approximately 50 nm to 20 μm. The at least one dielectric layer 102 may comprise any dielectric material appropriate for high frequency applications, such as, for example, FR4, polymers, such as, e.g., liquid crystal polymer (LCP), polytetrafluorethylen (PTFE), or polyimide and ceramics, such as alumna ($Al_2O_3$) or aluminum nitride (AlN). The thickness of the dielectric layer 102 is in the range of approximately 0.1-2 mm. The dielectric constant ($\in_r$) of the employed dielectric materials, determining the velocity of propagation of an electromagnetic wave in the dielectric material, is in the range of approximately 2-10, wherein a lower dielectric constant corresponds to a higher velocity of propagation and, hence, to a greater wavelength. The loss angle of the used dielectric materials, influencing the attenuation of a high frequency wave propagating in the dielectric material, is in the range of approximately 0.001-0.1.

The transition structure 108 is formed in the multi-layer printed circuit board 100. A hole 112 is formed in the layer stack 110, for example, by well-known mechanical or laser-based techniques or by etching. Subsequently, the walls of the hole are plated by well-established plating technologies to form the impedance adapting structure 106. The total thickness of the plated layer is in the range of approximately 5-50 μm. It is to be noted that at high frequencies, due to the skin effect, the current may be concentrated to a surface sub-layer (not shown) with a thickness of only several Em. Thus, a thin plated layer may be sufficient for the transition structure 108 in high frequency applications. As a next step, the hole comprising the plated layer forming the impedance adapting structure 106 is filled by a dielectric material 132. The material 132 may by the same as the dielectric material 102 or may comprise an alternative material with an appropriate electrical characteristic. Subsequently, an inner hole 116 is formed that is substantially coaxially aligned with the impedance adapting structure 106, by mechanical or laser-based techniques or by etching to form the through connection 104 therein. The plating technologies employed to form the impedance adapting structure 106 may also be applied to form a plated layer at the wall of the inner hole 116 forming the through connection 104. Since, due to the skin effect, the current in the through connection 104 is concentrated to a thin outer sub-layer (not shown), an inner portion (not shown) of the through connection 104 may be filled by a dielectric material, if desired, without a substantial increase of an electrical resistance exerted to high frequency signals.

The diameters 113, 111 of the impedance adapting structure 106 and of the through connection 104 are adapted to a desired impedance value, for example, to the input/output impedance of a connected transceiver and/or a connected microstrip line. The desired impedance value is in the range of approximately 10-300Ω and in a specific embodiment approximately 50Ω. The characteristic impedance of a substantially coaxial structure depends on the dielectric constant ($\in_r$) of the material 132 and on the ratio of an outer diameter 111 ($d_2$) of the through connection 104 and an inner diameter 113 ($d_1$) of the impedance adapting structure 106 ($Z_0 \approx 60/\in_r^{1/2} \times \ln(d_1/d_2)$). Thus, the impedance of the transition structure 108 may be adapted to a desired impedance value by choosing the material 132 and/or by choosing the ratio of the diameters 111 and 113. For a dielectric constant ($\in_r$) of 4 (e.g., FR4 material) and a characteristic impedance in the range of 10-300Ω, the ratio of the diameters 111 and 113 is in the range of approximately 1.5 to 22,000. For the impedance value of 50Ω and a dielectric constant ($\in_r$) in the range of 2-10, the ratio of the diameters 111 and 113 is in the range of approximately 3.2 to 14. In a specific embodiment, the dielectric constant ($\in_r$) is approximately 4 and the characteristic impedance is approximately 50Ω, and the resulting ratio of the diameters 111 and 113 is approximately 8.8. In a further embodiment, the geometrical parameters of the transition structure 108 may be determined by well-known 3D-electromagnetic-field-simulation techniques, for example, by finite element methods, to account for additional effects of connected structures, for example, of a bump structure (not shown) or of a transition (not shown) to a microstrip line.

Figure 2:
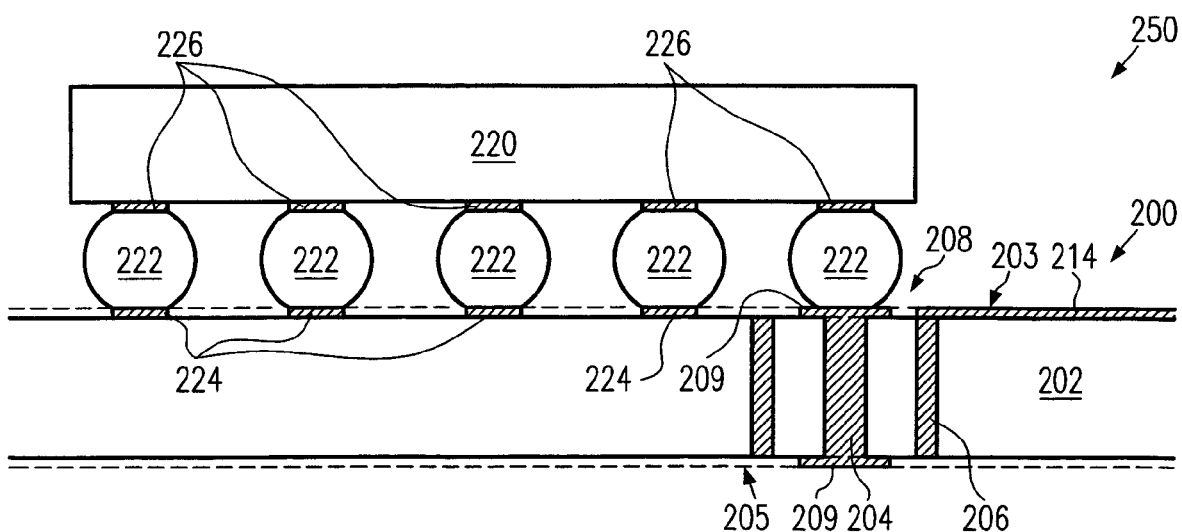
FIG. 2 shows a sectional view of a high frequency device according to the present invention.

FIG. 2 schematically represents a sectional view of a high frequency device 250 in accordance with an illustrative embodiment of the present invention. A high frequency integrated circuit die 220 comprising bond pads 226 is bonded onto a high frequency multi-layer printed circuit board 200 by bonds 222. The multi-layer printed circuit board 200 comprises first and second metal-comprising layers 203, 205, a dielectric layer 202, bond pads 224, conductive connection lines 214, and a transition structure 208. The transition structure 208 comprises a through connection 204 and an impedance adapting structure 206.

The multi-layer printed circuit board 200 and the transition structure 208 may be formed as set forth with respect to FIGS. 1a and 1b. The bond pads 224, 209 are formed in the first and second metal-comprising layers 203, 205 of the multi-layer printed circuit board 200 by well-established multi-layer PCB technologies. The through connection 204 of the transition structure 208 is in contact with the bond pads 209 so that a high frequency signal from the integrated circuit die 220 may be conducted through the respective bond 222 and the through connection 204 to a component (not shown) disposed on the opposite side of the multi-layer printed circuit board 200. The bonds 222 depicted in FIG. 2 show bump bonds but may, in another embodiment, comprise TAB-bonds or wire bonds. In a further embodiment, the multi-layer printed circuit board 200 may be employed as a chip carrier for one or more die including at least one high frequency integrated circuit. In particular, for flip chip bonded die, the chip carrier may serve to redistribute, for example, a dense peripheral bond pad arrangement to a wider spread array bond pad arrangement even when high frequency terminals are involved. Thus, small chip carriers comprising an elaborate fine-pitch layout may be mounted on large PCBs (not shown) to mitigate the layout requirements of large main boards (not shown) to reduce the overall manufacturing costs of electronic components. On the main board may be mounted additional components requiring only a coarse-pitch layout, for example, key pads, passive devices, antennas, etc. Thus, in corresponding applications, low cost FR4 PCBs may be employed for the main boards. In one embodiment utilizing the transition structure 208, even the high frequency chip carrier may be manufactured of FR4 material providing a cost-effective high frequency chip carrier for large-scale production. The chip carrier may be mounted on the main board by a bump bond process or by a readily unlockable plug and socket connection.

Figure 3A:
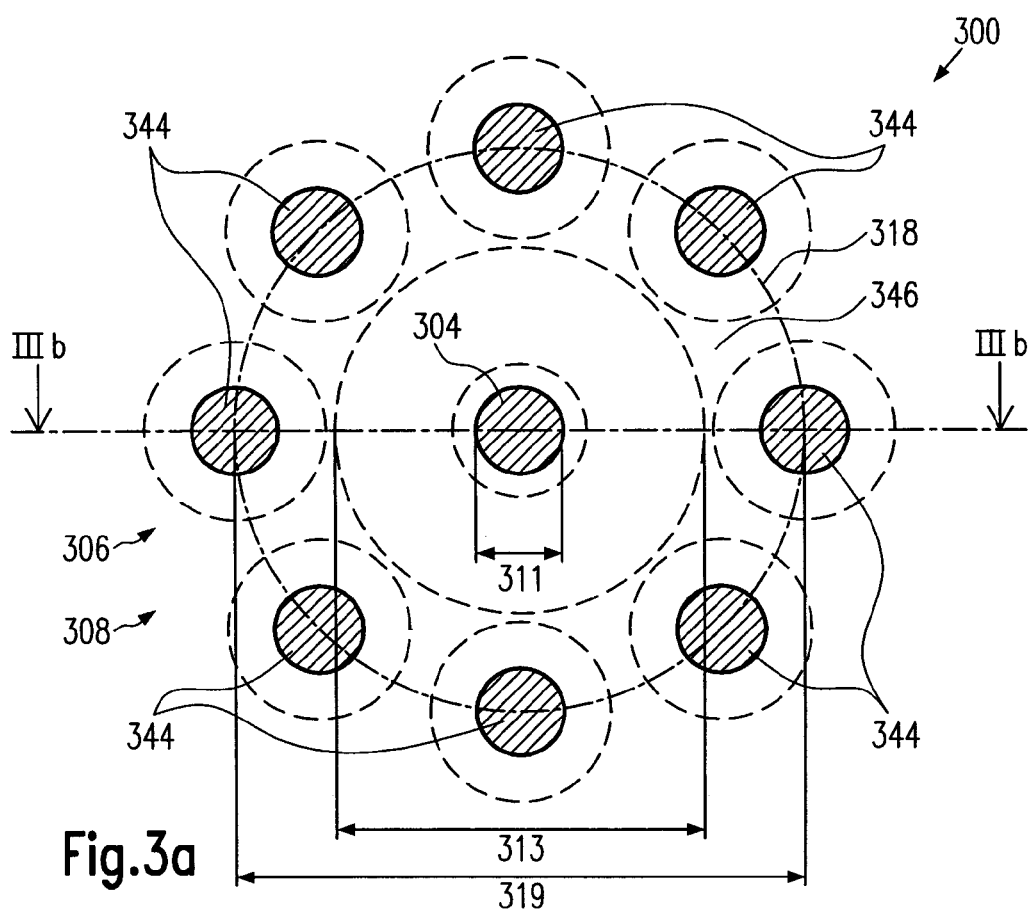
FIG. 3a represents a plan view and FIG. 3b a sectional view of a transition structure being adapted to currently achievable multi-layer printed circuit board design rules.
Figure 3B:
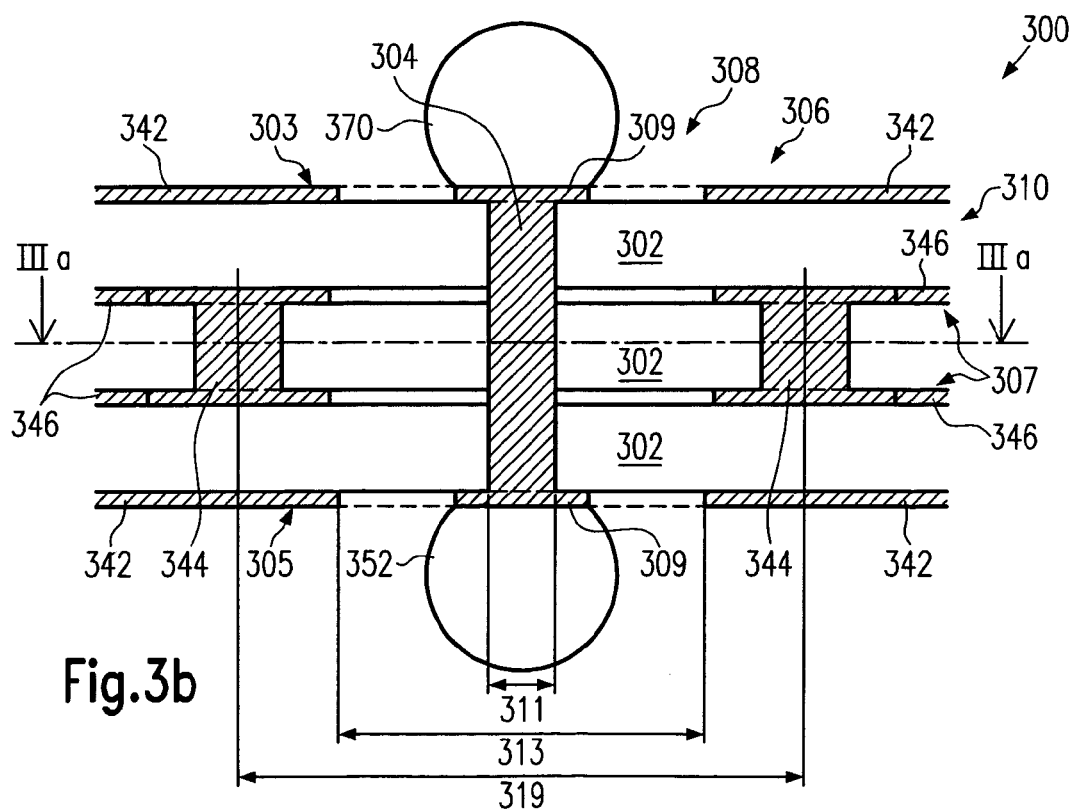

FIG. 3a represents a plan view and FIG. 3b a sectional view of a multi-layer printed circuit board 300 comprising a further embodiment of a transition structure 308 according to the present invention. The multi-layer printed circuit board 300 comprises a layer stack 310 comprising a first metal-comprising layer 303 and a second metal-comprising layer 305, two metal-comprising inner layers 307 disposed between the first and second metal-comprising layers 303, 305, and three dielectric layers 302 separating the metal-comprising layers 303, 305, 307. The transition structure 308 comprises a through connection 304, and a impedance adapting structure 306. The impedance adapting structure 306 comprises eight coaxial vias 344, and metal-containing regions 342, 346 substantially coaxially aligned to the through connection 304.

The multi-layer printed circuit board 300 is formed by well-established multi-layer PCB techniques, wherein, as a first step, the two metal-comprising inner layers 307 are patterned to form the metal-containing regions 346. The ratio of an inner diameter 313 of the metal-containing regions 346 and an outer diameter 311 of the through connection 304 may be determined as set forth with respect to the transition structure 108 of FIG. 1 in analogy to the described coaxial embodiment or by calculations based on electromagnet field simulations. The coaxial vias 344 are arranged on a substantially circular line 318 which is substantially coaxially aligned with the through connection 304 to be formed subsequently. The diameter 317 of the circular line 318 is also determined with respect to the impedance of the transition structure 308. In one embodiment, the coaxial vias 344 may be disposed on the substantially circular line so that the innermost portions of the vias 344 are tangent to a circle with the diameter 313. The two metal-containing regions 346 are conductively connected by the coaxial vias 344. After the layer stack comprising the two metal-comprising inner layers 307 is completed, the first and second metal-comprising layers 303, 305 are laminated on the opposite sides of the inner layer stack each separated by one of the dielectric layers 302, respectively. The first and second metal-comprising layers are patterned by well-known PCB patterning processes. In these layers 303, 305, the metal-containing regions 342 are provided corresponding to the metal-containing regions 346 to form a part of the impedance adapting structure 306. The outer boundaries (not shown) of the metal-containing regions 346, 342 do not substantially affect the impedance of the transition structure 308 and may, for instance, be arbitrarily defined as long as the shape is in accordance with the design rules of the employed PCB technology. The metal-containing regions 342, 346 and coaxial vias 344 of the impedance adapting structure 306 commonly provide impedance adjusting functionality comparable to the impedance adapting structure 106 described with respect to FIGS. 1a and 1b.

The through connection 304 extending from the first metal-comprising layer 303 through the two metal-comprising inner layers 307 and the three dielectric layers 302 to the second metal-comprising layer 305 is formed by well-known multi-layer PCB technologies. Pads 309 may be formed on the first and second metal-comprising layers 303, 305 to allow for a reliable connection of the through connection 304. The through connection 304 may be connected directly by die bonds such as, for example, bump bonds 370 or wire bonds (not shown). In another embodiment, the through connection 304 may be connected by conduction lines having a defined impedance, such as, for instance, microstrip lines (not shown). The connection may further comprise balun transformers (not shown) to meet symmetry requirements.

In the depicted embodiment, eight coaxial vias 344 are approximately equidistantly arranged on the substantially circular line 318. In another embodiment, a different number of coaxial vias 344, for example, six or twelve coaxial vias 344 may be arranged on the circular line 318. In a further embodiment, the impedance adapting structure 306 may be connected to the ground potential.

Figure 4:
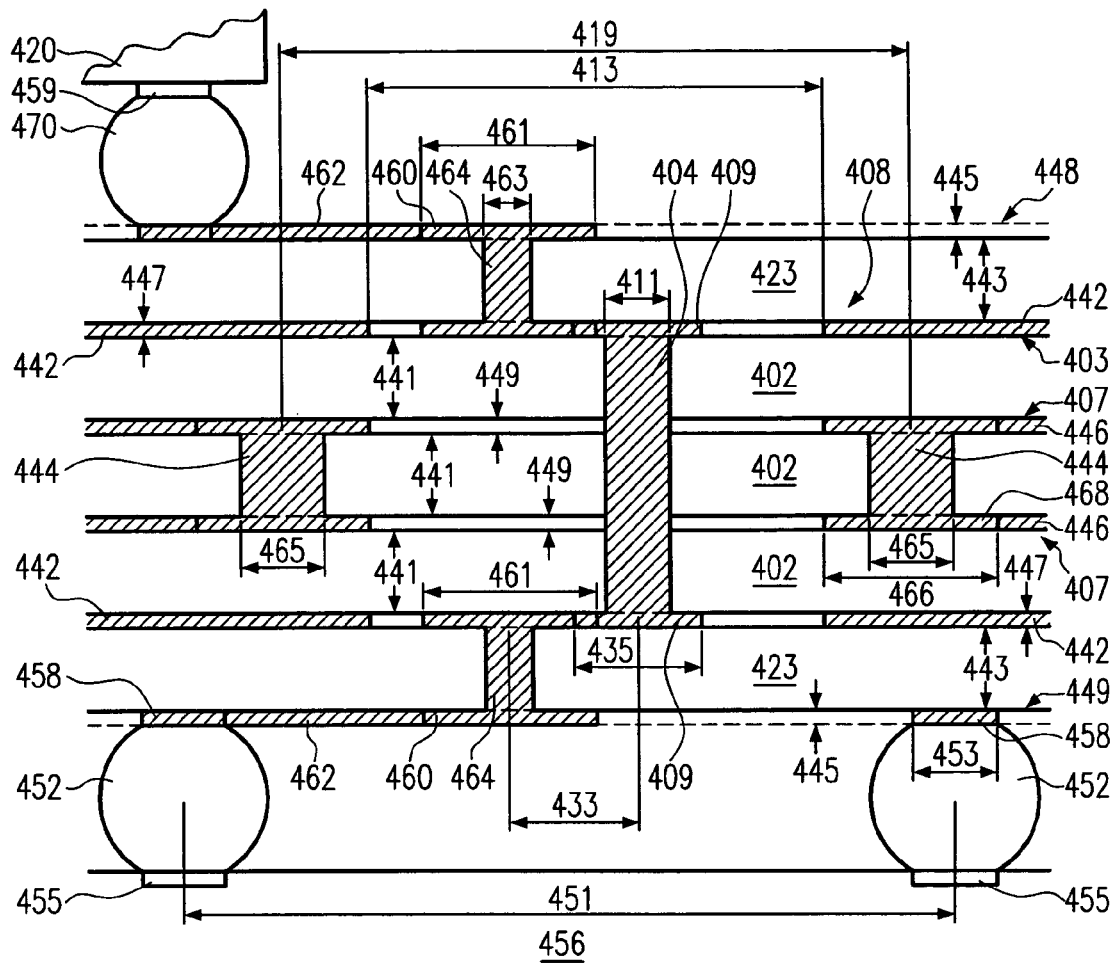
FIG. 4 represents a sectional view of a multi-layer printed circuit board (PCB) comprising the high frequency transition structure of FIGS. 3a and 3b and being adapted to currently achievable FR4-PCB design rules.

FIG. 4 represents a sectional view of a specific embodiment of a multi-layer high frequency PCB 400 comprising a high frequency transition structure 408 as is indicated as structure 308 in FIGS. 3a and 3b, wherein the layout is adapted to currently achievable FR4-PCB design rules. The multi-layer high frequency PCB 400 comprises, in addition to the transition structure 408, a first metal-containing outer layer 448 and a second metal-containing outer layer 449, each separated by an outer dielectric layer 423, two outer vias 464, two microstrip lines 462 and bond pads 458. FIG. 4 further depicts bump bonds 470, 452 and a main board 456 and a part of a die 420 bonded to the PCB 400.

The through connection 404 of the transition structure 408 is at one side connected to a bond pad 459 of a high frequency terminal of the die 420 and at the opposite side to a bond pad 455 of the main board 456. The connection is effected by the outer vias 464 and the microstrip lines 462. The microstrip lines 462 are designed by well-known design rules taking into account the width and thickness of the line and its distance to the adjacent ground layer. In a further embodiment, the bump bonds 452 connecting the main board 456 and/or the bump bonds 470 connecting the die 420 may be directly formed on bond pads 460 disposed on the outer vias 464 and the microstrip lines may be omitted. The impedance adjustment may be performed as set forth with respect to the impedance adapting structure 306 of FIGS. 3a and 3b by using the coaxial line approach or by electromagnetic field simulation. The simulation may further take the influence of the outer vias 464 and/or of the bump bonds 450, 452 into account.

In one embodiment of the multi-layer PCB 400, the metal-comprising layers 403, 405, 407, 448 and 449 comprise copper and a thickness 445 of the first and second metal-comprising outer layers 448, 449 is approximately 40 µm, a thickness 447 of the first and second metal-comprising layers 403, 405 is approximately 20 µm, and a thickness 449 of the metal-comprising inner layers 407 is approximately 30 µm. The dielectric layers 402, 423 comprise flame-retardant fiberglass epoxy laminate (FR4) having a dielectric constant of approximately 4.4 at a frequency of 1 GHz. A thickness 441 of the dielectric layers 402 is approximately 100 µm and a thickness 443 of the dielectric outer layers 423 is approximately 63 µm. An outer diameter 411 of the through connection 404 is approximately 240 µm and a diameter 435 of the pads 409 is approximately 500 µm. An inner diameter 413 of the metal-comprising regions 442, 446 formed in the first and second metal-comprising layers 403, 405, 407 is approximately 1090 µm. A diameter 419 of the substantially circular line defining the position of the eight coaxial vias 444 is approximately 1400 µm. A diameter 466 of the pads 468 of the coaxial vias 444 is approximately 500 µm and a diameter 465 of the through connection of the coaxial vias 444 is approximately 200 µm. A diameter 461 of the pads 460 of the outer vias 464 is approximately 250 µm and a diameter 463 of the through connection of the outer vias 464 is approximately 100 μm. A distance 433 between the axis of the through connection 404 and the axis of the outer vias 464 is approximately 300 μm so that the pads 409 of the through connection 404 and the pads 460 of the outer vias 464 partially overlap. A diameter 453 of the bump pads 458 is approximately 600 μm and the distance 451 between the centers of adjacent bump pads 458 is approximately 1270 μm.

The measured insertion loss of the transition structure including the outer vias 464 (without the attenuation caused by the microstrip lines) is approximately −0.29 dB at a signal frequency of 2.4 GHz. Calculated scattering parameters (or S-parameters) confirm the measurement results. The calculations were performed based on the material parameters $\kappa_{Cu}$=5.8 S/m as the electrical conductivity of copper and tan δ=0.04 as the loss angle of FR4. The resulting input reflectance factors $S_{11}$ are: 0.003/−94° at 0.1 GHz; 0.050/−170° at 2.4 GHz and 0.092/64° at 6.0 GHz and a corresponding reflectance damping of approximately −52 db, −26 db and −21 db, respectively. The results for the transmission loss $S_{12}$ are: −0.01 db at 0.1 GHz; −0.17 db at 2.4 GHz and −0.54 db at 6.0 GHz and for the output reflectance factor $S_{22}$: 0.003/−93° at 0.1 GHz; 0.047/−155° at 2.4 GHz and 0.095/83° at 6.0 GHz. The obtained results demonstrate that a multi-layer transition structure formed in an FR4 PCB by employing merely currently available standard structures may provide an appropriate impedance adaptation to transmit signals in the GHz frequency range.

For some applications, the impedance adapting structure may be simplified to increase the cost-effectiveness of the PCB manufacturing process while still providing sufficient impedance adaptability. With respect to FIGS. 5a, 5b, 6a, 6c, 7a and 7b, corresponding embodiments of impedance adapting structures for high frequency multi-layer PCBs are described in the following. The simplified impedance adapting structures are designed to reduce the number of required layers of the multi-layer stack and/or to reduce the required PCB area. Combinations of the features of the different embodiments of the invention may be employed to obtain further impedance adapting structures.

Figure 5A:
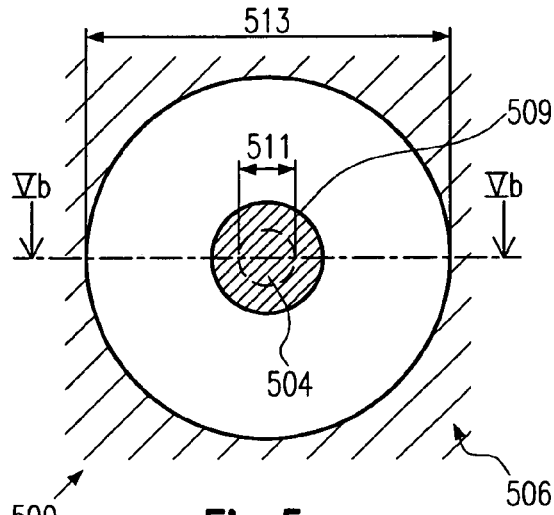
FIG. 5a shows a plan view and FIG. 5b a sectional view of a multi-layer printed circuit board with another high frequency transition structure according to an embodiment of the present invention.
Figure 5B:
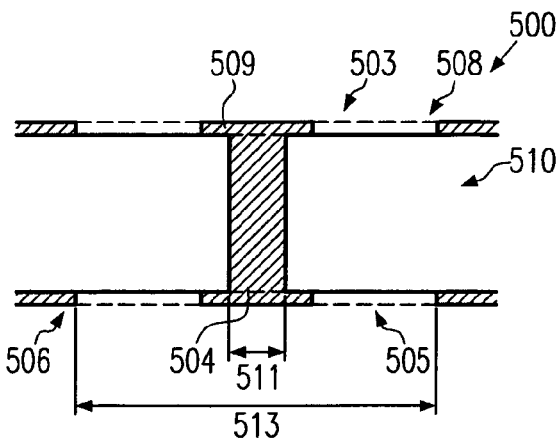

FIG. 5a represents a plan view and FIG. 5b a sectional view of a further embodiment of a high frequency printed circuit board 500 comprising a transition structure 508. The high frequency circuit board 500 is comprised of a multi-layer stack 510 comprising a first metal-comprising layer 503 and a second metal-comprising layer 505. The transition structure 508 comprises a through connection including pads 509 and an impedance adapting structure 506.

The high frequency printed circuit board 500 comprises only standard components and may, thus, be manufactured by well-established conventional PCB technologies.

The inner diameter 513 of the impedance adapting structure 506 may be adapted to reduce an impedance mismatch of the through connection 504 and connected structures. The appropriate diameter may be determined by reflectance measurements carried out with corresponding test structures or by calculation. The calculation may be based, as described above, on the coaxial line approximation taking on the ratio of diameters 513 and 511 into account, or on well-established electromagnetic field simulations. The simulations may also take the influence of connected structures into account. In one embodiment, the ratio of the diameters 513 and 511 is in the range of approximately 2 to 10.

Figure 6A:
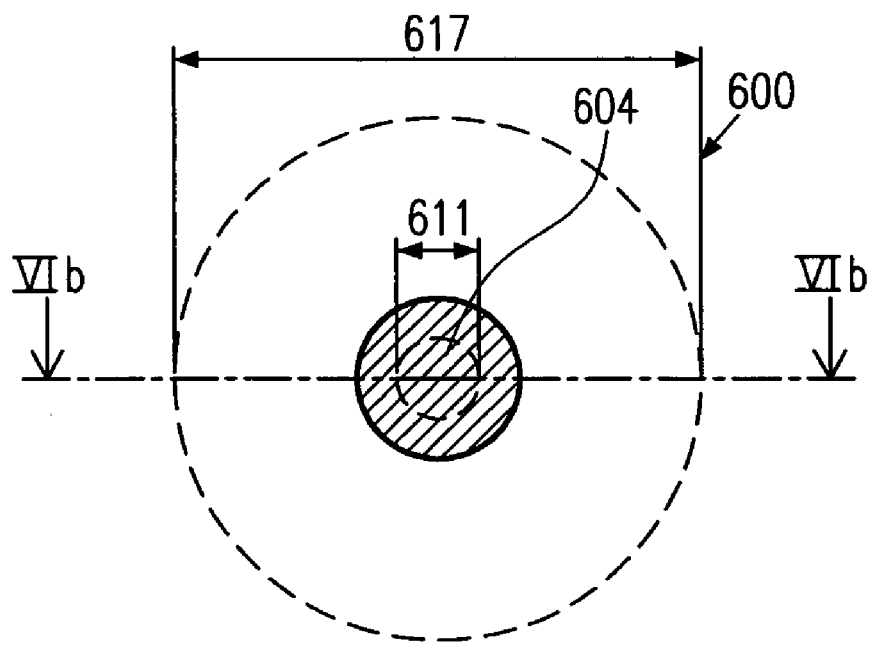
FIG. 6a represents a plan view and FIG. 6b a sectional view of a multi-layer printed circuit board with a high frequency transition structure according to still another embodiment of the present invention.
Figure 6B:
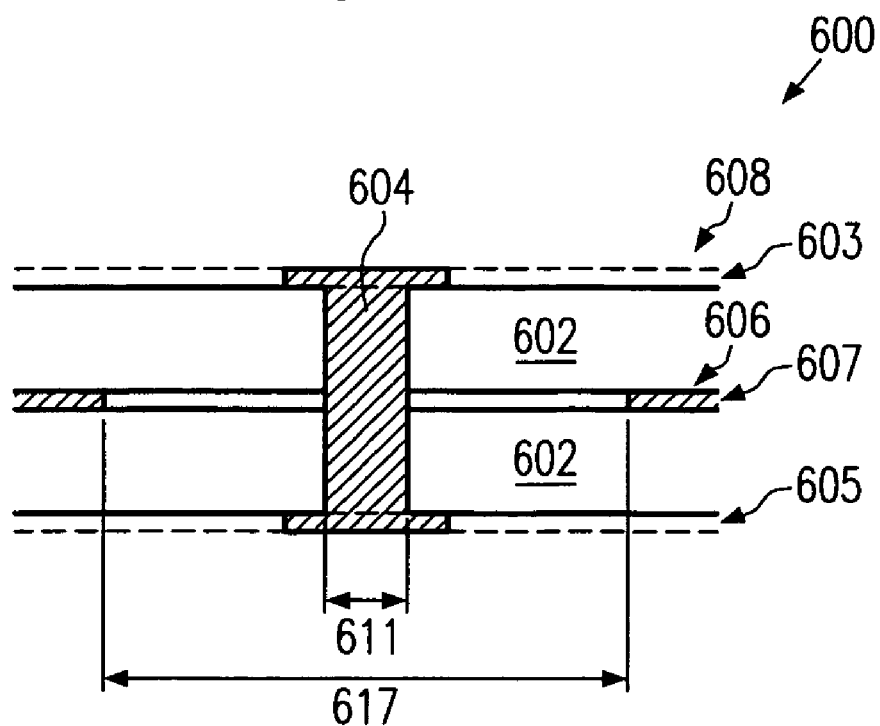

FIG. 6a represents a plan view and FIG. 6b a sectional view of a further embodiment of a high frequency printed circuit board 600 similar to the embodiment shown in FIGS. 5a and 5b. Contrary thereto, the embodiment of FIGS. 6a and 6b comprises at least one additional metal-comprising inner layer 607 disposed between the first and second metal-comprising layers 603, 605, and at least two dielectric layers 602 separated by the at least one metal-comprising inner layer 607. The through connection 604 extends from the first metal-comprising layer 603 through the at least two dielectric layers 602 and the at least one metal-comprising inner layer 607 to the second metal-comprising layer 605. Contrary to the embodiment of FIGS. 5a and 5b, the impedance adapting structure 606 of the transition structure 608 is formed in the metal-comprising inner layer 607. The impedance of the transition structure 608 may be adapted to a desired value by adjusting the ratio of the diameter 617 of the impedance adapting structure 606 and the diameter 611 of the through connection 604. In one embodiment, the ratio of the diameters 617 and 611 is in the range of approximately 2 to 10.

Figure 7A:
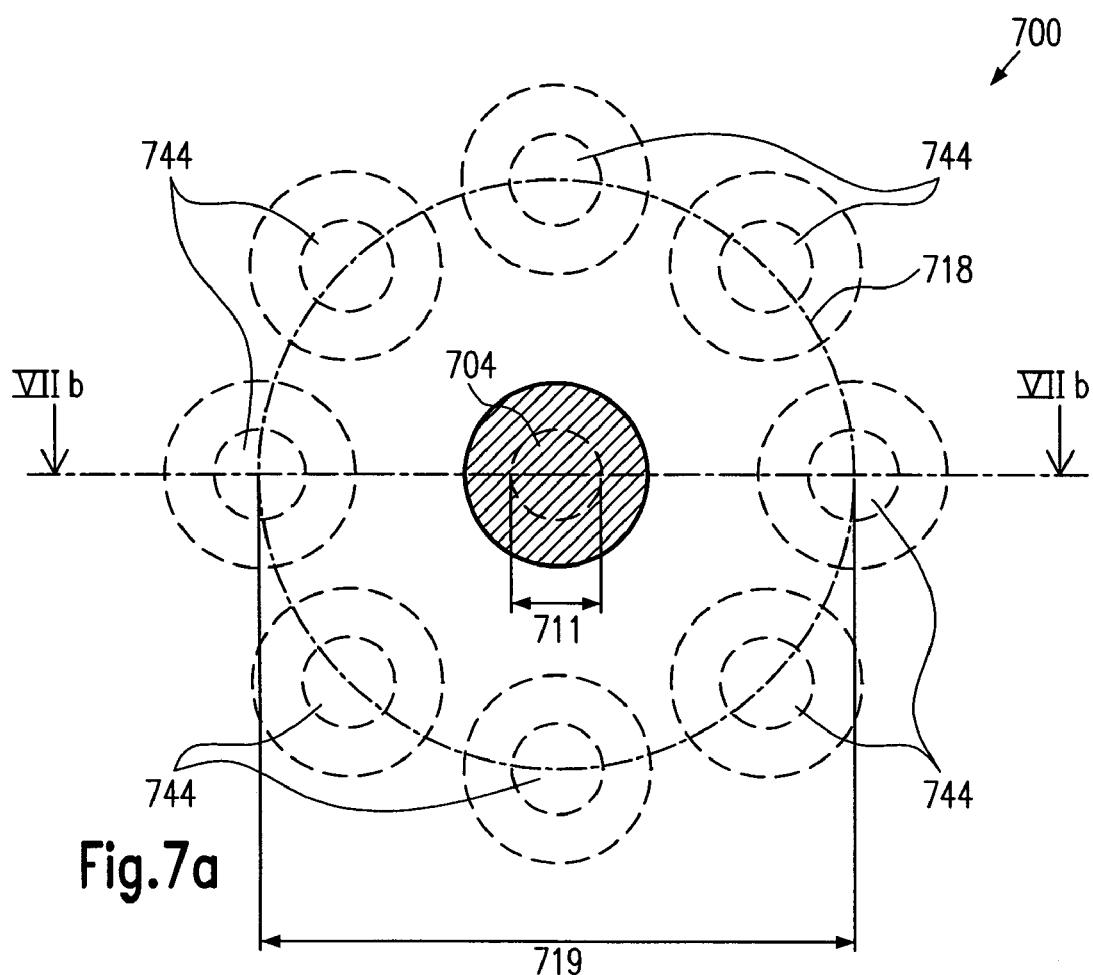
FIG. 7a represents a plan view and FIG. 7b a sectional view of a multi-layer printed circuit board with a high frequency transition structure according to yet another embodiment of the present invention.
Figure 7B:
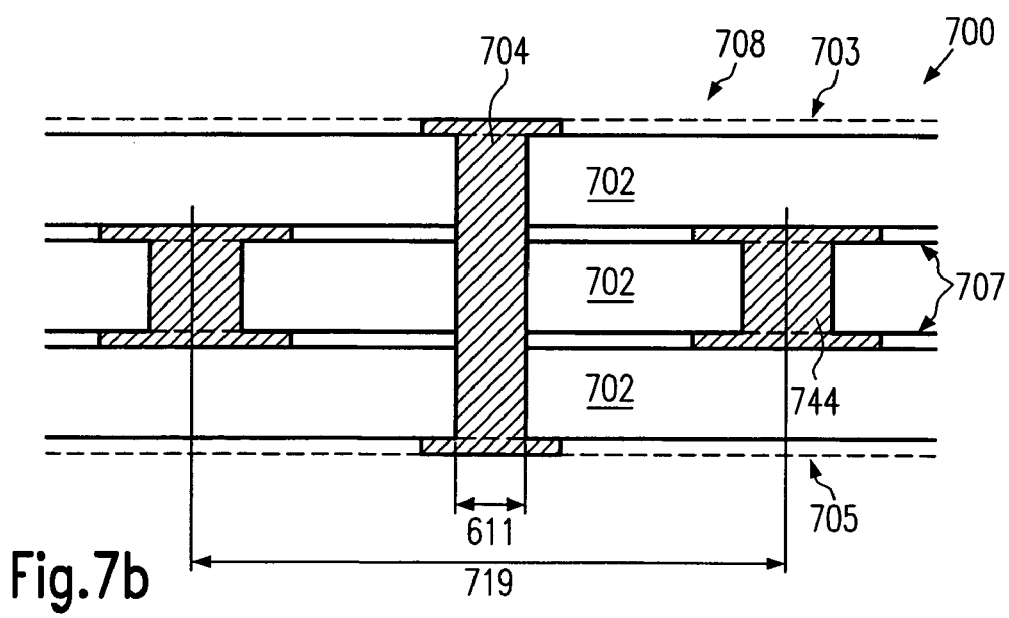

FIG. 7a represents a plan view and FIG. 7b a sectional view of a further embodiment of a high frequency printed circuit board 700 similar to FIGS. 6a and 6b. Contrary thereto, the embodiment of FIGS. 7a and 7b comprises at least two metal-comprising inner layers 707, and at least three dielectric layers 702 separated by the at least two metal-comprising inner layers 707. The through connection 704 extends from the first metal-comprising layer 703 through the at least three dielectric layers 702 and the at least two metal-comprising inner layers 707 to the second metal-comprising layer 705. Contrary to the embodiment of FIGS. 6a and 6b, the impedance adapting structure 706 is formed by coaxial vias 744 disposed on a circular line 718 between at least two metal-comprising inner layers 707 as described above, with respect to FIGS. 3a and 3b. The impedance of the transition structure 708 may be adapted to a desired value by adjusting the ratio of the diameter 719 of the circular line 718 and the diameter 711 of the through connection 704. In one embodiment, the ratio of the diameters 719 and 711 is in the range of approximately 3 to 20.

As a result, the present invention provides a multi-layer printed circuit board for high frequency applications. The multi-layer printed circuit board comprises a transition structure allowing adaptation of its impedance to a desired value, for example, to the output/input impedance of a transceiver device so that a high frequency signal from/to the transceiver may be led to the opposite side of the multi-layer printed circuit board, for instance, to feed the signal to an antenna printed on the multi-layer printed circuit board. Furthermore, the proposed transition structure may be used to manufacture high frequency chip carriers, for example, for flip chip applications, that allow redistribution of a fine-pitch bond pad arrangement of a die into a coarse-pitch bond pad arrangement, even when high frequency die terminals are involved. The achieved impedance adaptability is sufficient to achieve the required transmission behavior even when FR4 material is used as the substrate material so that cost-efficient multi-layer printed circuit boards and chip carriers may be provided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A high frequency multi-layer printed circuit board, comprising:
   a layer stack comprising a first metal-comprising layer, a second metal-comprising layer,
      a first outer metal-comprising layer, a second outer metal-comprising layer, and a plurality of dielectric layers including at least a first dielectric layer separating said first and second metal-comprising layers, at least a second dielectric layer separating said first metal-comprising layer and said first outer metal-comprising layer, and at least a third dielectric layer separating said second metal-comprising layer and said second outer metal-comprising layer; and
   a transition structure comprising:
      a through connection extending from said first metal-comprising layer through said first dielectric layer to said second metal-comprising layer;
      an impedance adapting structure surrounding said through connection at least partially and providing a characteristic impedance of said transition structure, said characteristic impedance being adapted to a desired impedance value; and
      an outer via connecting said through connection to a structure disposed on said first outer metal-comprising layer.

2. The high frequency multi-layer printed circuit board of claim 1, wherein said impedance adapting structure is substantially coaxially aligned to said through connection and provides said desired impedance value of said characteristic impedance of said transition structure by an adjusted inner diameter of said impedance adapting structure.

3. The high frequency multi-layer printed circuit board of claim 1, wherein said impedance adapting structure is formed by substantially concentric metal-free regions surrounded by metal-containing regions, said metal-free regions being substantially coaxially aligned to said through connection and having a diameter being adapted to said desired impedance value.

4. The high frequency multi-layer printed circuit board of claim 3, further comprising:
   at least one metal-comprising inner layer disposed between said first and second metal-comprising layers;
   wherein said first dielectric layer comprises at least two dielectric layers separated by said metal-comprising inner layer;
   said through connection extending from said first metal-comprising layer through said at least two dielectric layers and said at least one metal-comprising inner layer to said second metal-comprising layer; and
   wherein said impedance adapting structure is formed in said inner metal-comprising layer by a substantially concentric metal-free region surrounded by a metal-containing region, said metal-free region being substantially coaxially aligned to said through connection and having a diameter being adapted to said desired impedance value.

5. The high frequency multi-layer printed circuit board of claim 3, further comprising:
   at least two metal-comprising inner layers disposed between said first and second metal-comprising layers;
   wherein said first dielectric layer comprises at least three dielectric layers separated by at least one of said at least two metal-comprising inner layers, respectively;
   said through connection extending from said first metal-comprising layer through said at least two metal-comprising inner layers and said at least three dielectric layers to said second metal-comprising layers; and
   wherein said impedance adapting structure is formed between at least two of said at least two metal-comprising inner layers by a plurality of coaxial vias arranged on a substantially concentric substantially circular line that is substantially coaxially aligned to said through connection.

6. The high frequency multi-layer printed circuit board of claim 5, wherein said coaxial vias are equidistantly arranged on said substantially circular line.

7. The high frequency multi-layer printed circuit board of claim 5, wherein said coaxial vias are comprised of eight coaxial vias.

8. The high frequency multi-layer printed circuit board of claim 3, wherein said metal-containing regions surrounding said substantially concentric metal-free regions are electrically connected to a ground potential.

9. The high frequency multi-layer printed circuit board of claim 3, wherein said through connection is electrically connected to at least one microstrip line.

10. The high frequency multi-layer printed circuit board of claim 3, wherein said through connection is electrically connected by a bump structure.

11. The high frequency multi-layer printed circuit board of claim 1, wherein said at least one dielectric layer comprises FR4.

12. The high frequency multi-layer printed circuit board of claim 1, wherein said desired impedance value is approximately 50 Ω.

13. A high frequency device, comprising:
   an integrated high frequency circuit die comprising a high frequency terminal; and
   a high frequency multi-layer printed circuit board comprising a transition structure, wherein the integrated high frequency circuit die is mounted on said high frequency multi-layer printed circuit board and said high frequency terminal is connected to said transition structure,
   wherein said high frequency multi-layer printed circuit board comprises:
      a layer stack comprising a first metal-comprising layer, a second metal-comprising layer, a first outer metal-comprising layer, a second outer metal-comprising layer, and a plurality of dielectric layers including at least a first dielectric layer separating said first and second metal-comprising layers, at least a second dielectric layer separating said first metal-comprising layer and said first outer metal-comprising layer, and at least a third dielectric layer separating said second metal-comprising layer and said second outer metal-comprising layer; and
   said transition structure comprises:
      a through connection extending from said first metal-comprising layer through said first dielectric layer to said second metal-comprising layer;
      an impedance adapting structure surrounding said through connection at least partially and providing a characteristic impedance of said transition structure, said characteristic impedance being adapted to a desired impedance value; and
      an outer via connecting said through connection said high frequency terminal.

14. A method of manufacturing a high frequency multi-layer printed circuit board, the method comprising:
   choosing a desired impedance value;
   forming a layer stack comprising at least a first metal-comprising layer, a second metal-comprising layer, a first outer metal-comprising layer, a second outer metal-comprising layer, and a plurality of dielectric layers including at least a first dielectric layer separating said first and second metal-comprising layers, at least a second dielectric layer separating said first metal-comprising layer and said first outer metal-comprising layer, and at least a third dielectric layer separating said second metal-comprising layer and said second outer metal-comprising layer;

forming a through connection extending from said first metal-comprising layer through said first dielectric layer to said second metal-comprising layer;

forming an impedance adapting structure surrounding said through connection at least partially and adapting therewith the characteristic impedance of a transition structure to said desired impedance value, wherein the transition structure is comprised of said through connection and said impedance adapting structure; and forming an outer via connecting said through connection to a structure disposed on said first outer metal-comprising layer.

15. The method of claim 14, wherein said adapting of said characteristic impedance of said transition structure is performed by adjusting a diameter of said impedance adapting structure.

16. The method of claim 14, wherein forming the through connection and the impedance adapting structure further comprises forming the through connection and the impedance adapting structure to accommodate a signal with a frequency of approximately 1 GHz or higher.

* * * * *